324-77. SR 06-15-71 OR 3,585,498

[11] 3,585,498

[72] Inventor Robert E. Chandos
Santa Barbara, Calif.
[21] Appl. No 773,692
[22] Filed Sept. 26, 1968
[45] Patented June 15, 1971
[73] Assignee Electro-Optical Industries, Inc.

[54] ACTIVE DIGITAL FILTER USING A MULTISTAGE RING COUNTER DRIVEN BY A CLOCK SOURCE

11 Claims, 3 Drawing Figs.

[52] U.S. Cl. 324/77, 328/167
[51] Int. Cl. G01s 23/16
[50] Field of Search 324/77; 333/70 A; 328/43, 167; 307/223

[56] References Cited

UNITED STATES PATENTS 3,445,685 5/1969 Roth 328/167 X

*Primary Examiner*—Edward E. Kubasiewicz
*Attorney*—Don R Finkelstein

ABSTRACT: There is disclosed herein a digital filter system for providing continuous frequency filtering of input signals of unknown frequency to allow their analysis and detection. It employs a bank of simple resistance-capacitance filters and novel switching means for accomplishing the continuous filtering utilizing a multistage ring counter driven by a clock signal source. Outputs are provided at each stage which through driver amplifiers, operate solid state switches to switch appropriate RC filters. The switches disclosed are solid state, metal oxide, field effect transistors and the ring counter includes novel reset circuitry which insures that the system is immune from transient noise spikes which would tend to interfere with proper operation. There is also a switching mechanism for the filters in which the input and output of each filter bank is simultaneously switched using only one switch per stage.

INVENTOR
ROBERT E. CHANDOS
BY
Don Finkelstein
ATTORNEY

INVENTOR
ROBERT F. CHANDOS
BY
Don Finkelstein
ATTORNEY

ACTIVE DIGITAL FILTER USING A MULTISTAGE RING COUNTER DRIVEN BY A CLOCK SOURCE

REFERENCE TO RELATED APPLICATIONS

The digital filter in accordance with this invention is an improved embodiment of the basic digital filter disclosed in the copending application Ser. No. 590,821 filed Nov. 31, 1966, for a Digital Wave Analyzer.

BACKGROUND OF THE INVENTION

In my Digital Wave Analyzer Patent application, Ser. No. 590,821, filed Nov. 31, 1966, I disclosed a novel frequency analyzer employing a variable frequency generator, a digital filter, and synchronous switching means. An important element of the combination is the digital filter which is comprised, basically of, a bank of variable cutoff frequency filters and means for synchronously switching the input and the output of each of the stages of the filter into the signal handling channel. Switching is under the control of the variable frequency generator comprising a part of the wave analyzer. In order to meet the requirements of the wave analyzer system, a most logical combination is a bank of low-pass filters, for example, 6 in number, with 6 relays at the input stage and 6 relays at the output stage and common synchronous which operators under the control of the variable frequency generator.

Ring counters have themselves long been used for sequential switching controlled by outputs from the individual stages of the counter. These ring counters have likewise included manual reset controls and the inherent feedback reset control from the last stage to the first. This arrangement does not, however, prevent the continuous circulation of more than a single bit which could result from a noise pulse arriving at the first stage of the ring counter.

SUMMARY OF THE INVENTION

I have produced an improved digital wave filter for use, in particular, in the Digital Wave Analyzer of my above mentioned copending application, but useful in other applications as well. I have substituted electronic switches of the metal-oxide-semiconductor field effect transistor type for previous switching elements and have thereby obtained improved switching performance and have provided one switch only per stage which inherently and simultaneously switches the input and output of the digital filter stage. Moreover, I have provided in the ring counter, which drives the switches, a normal manual and feedback reset and, in addition an automatic repetitive reset which will destroy a spurious circulating pulse in the system. This latter is accomplished by a logic network connected from the last stage of the ring counter and producing a reset pulse properly timed and properly applied to all stages whenever the last stage of the ring counter circulates the pulse back to the first stage.

One feature of the invention involves the combination of a ring counter with a plurality of solid-state switches each connected to a respective stage of the ring counter and switching the shunt branch of a multiple capacitance RC low-pass filter to provide a synchronously switched, low-pass filter.

Another feature of this invention resides in the combination of a ring counter with internal reset means which is operative to produce a reset pulse with each cycle of the ring counter whereby the ring counter is made virtually immune to extraneous pulses in the system.

BRIEF DESCRIPTION OF THE DRAWING

These and other features of this invention may be more clearly understood from the following detailed description and by reference to the drawing in which.

DESCRIPTION OF THE PREFERRED EMBODIMENT

Figure 1:
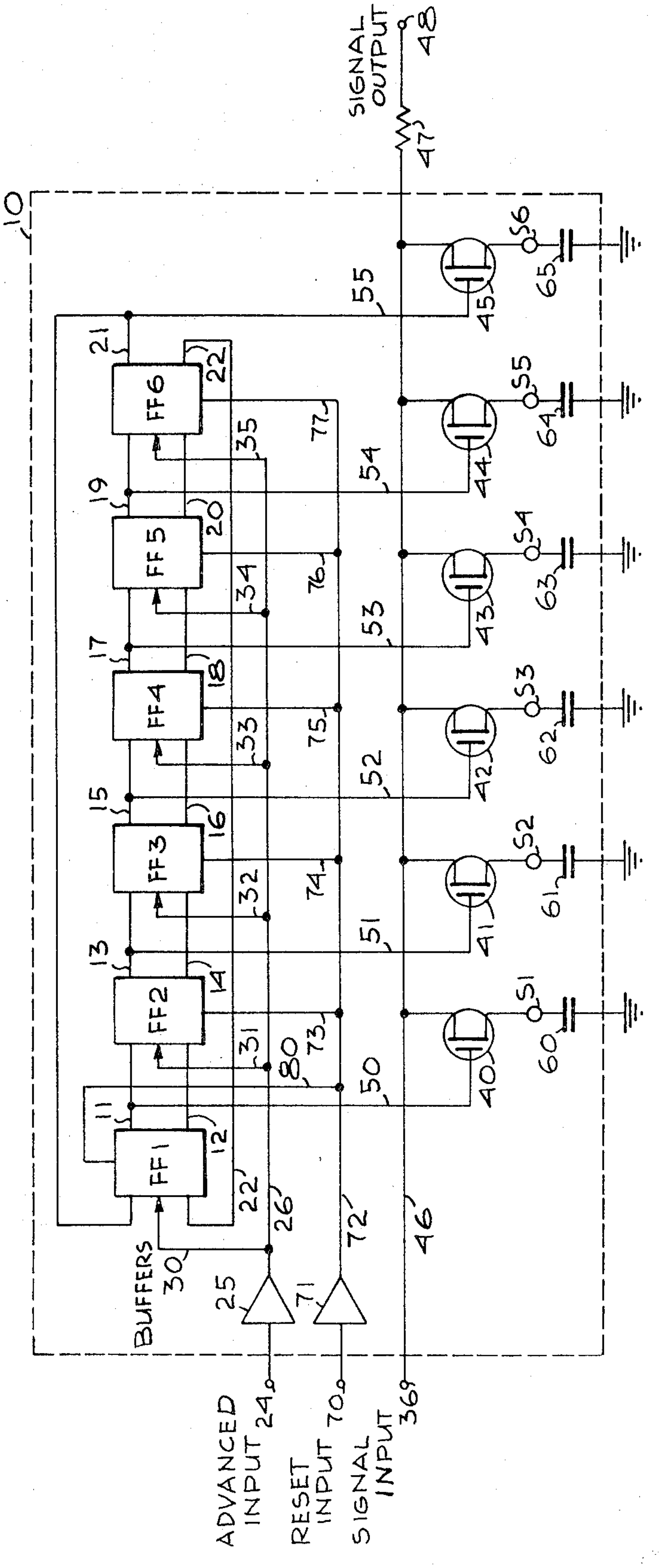
FIG. 1 is a block diagram of an embodiment of this invention.
Figure 2:
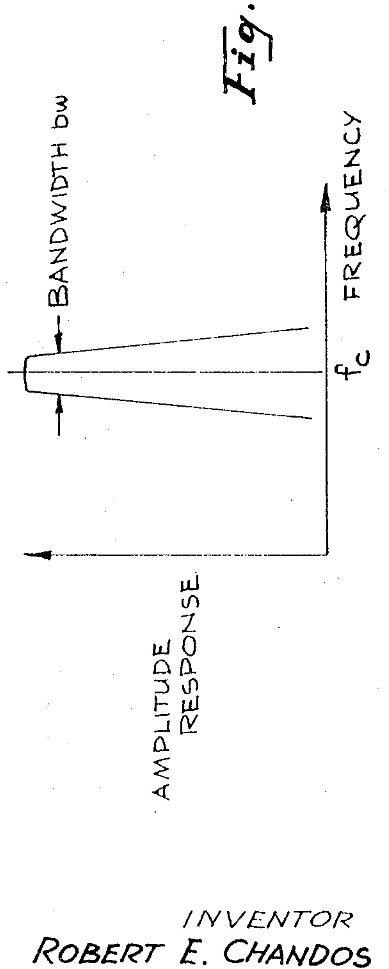
FIG. 2 is a graphical representation of the filter characteristics of the invention.

Now referring to the drawing, there is shown in FIG. 1, a digital filter 10 in accordance with this invention may be seen as comprising, for example, six stages of binary stages comprising bistable, multivibrators, or flip-flops, identified in the drawing as FF–1 thru FF–6 inclusive, all connected in conventional ring counter configuration with the output lead 11 of flip-flop FF–1 connected as the input to stage FF–2 and, with the complementary output over lead 12, introduced into the stage FF–2. The stage FF–2 is similarly connected over leads 13 and 14 to the following stage FF–2 The remaining stages FF–4, FF–5 and FF–6, of the ring counter are connected, respectively, with leads 15 and 16, 17 and 18, 19 and 20. Leads 21 and 22, constituting the primary and complementary output of the last stage FF–6 are, in conventional ring counter manner, fed back as the reset inputs to Stage FF–1. Advance pulses for the ring counter arrive at a first or advance signal input terminal 24 and are applied through buffer amplifier 25 to each of the stages FF–1 through FF–6, inclusive over bus 26 and their respective advance input leads 30 through 35, inclusive, respectively.

Associated with each flip-flop stage FF–1 through FF–6, inclusive, of the ring counter 10 are MOS transistor switches 40 thru 45 respectively, with the output signal in leads 11, 13, 15, 17 and 19 applied over branch leads 50—55 to the gate electrode of their associated MOS transistor 40—45 respectively. Each of the drain electrodes of the MOS transistor switches 40 thru 45 is connected to a respective capacitor 60 thru 65 with the second terminal of the capacitors 60 thru 65 connected to ground. Thus, the second terminals of each of the capacitors 60 through 65, which comprise shunt impedances, being connected to ground operatively receive signals for the condition of signals applied at the signal input terminal 36. The source electrode of each MOS transistor switch is connected by a common bus 46 through a common resistor 47 to the output terminal 48, and provides the signal output which comprises the input signal as applied at input signal terminal 36, which may be considered as a second signal input terminal for receiving the signal to be filter processed, after it has been modified by the digital filter 10 characteristics. As shown, the resistor 47, which comprises a series impedance, is connected in series between the signal input terminal 36 and the signal output terminal 48 in the common signal output line or bus 46. Each capacitor 60 thru 65, may be of a preselected size, for example, 1.0 micro farad which, with resistor 47, each forms a low pass filter of the same cutoff frequency.

In addition to the advance signal input terminal 24 and signal input terminal 36 to the ring counter 10 there is a reset input terminal 70 thru which external reset pulses may be applied thru buffer amplifier 71 and each of the stages FF–2 thru FF–6 on bus 72 and reset leads 73, 74, 75, 76 and 77, respectively. These reset leads 73 through 77 are all connected to the right terminal of the flip-flops which reset the flip-flops to the "zero" state. An additional lead 80 from bus 72 is connected to the "one" condition reset input of the stage FF–1. Therefore, whenever an external pulse arrives at reset input terminal 70, stages FF–2 thru FF–6 are reset to zero and Stage FF–1 is set to the "one" condition. The most common use of reset input is to reset the digital filter 10 when power is first applied to the system and whenever it is desired to manually reset the filter. When in the "one" reset condition, the flip-flop FF–1 is normally conducting which means that the transistor switch 40 is conducting and the digital filter has a low pass filter characteristic which is a function of the low pass characteristic of the shunt capacitor 60 with series resistor 47.

In operation, as advance pulses reach terminal 24 the "one" or conducting condition of the flip-flop stage FF–1 is advanced to the next stage FF–2 and the capacitor 61 is substituted for the capacitor 60. Each additional advance pulse switches the next sequential capacitor into the filter network until stage FF–6 is in its "one" or conducting condition and capacitor 65 is in the circuit. The next succeeding advance pulse resets the ring counter and stage FF–1 in switched back to the "one" or conducting condition and the sequence of switching commences again.

The sequential switching of the low pass filters results in a band-pass characteristic with center frequency ($f_c$) equal to the sequential switching frequency and a band width *bw* equal to "*n*" times the band width of each filter, where "*n*" equals the number of low pass filters which, in this embodiment, is 6.

It should be particularly noted in FIG. 1 that only a single switch per stage is required to change the frequency pass characteristics of the filter and the switches used are preferrably metal oxide, semiconductor transistor switches such as type M–103 produced by Siliconix, Incorporated of 1140 West Evelyn Avenue, Sunnyvale, California 94086. These switches exhibit the desirable characteristic of high switching speed, for example, less than 0.15 microsecond, an impedance of approximately 75 ohms when in the conducting condition and impedance greater than 1 megohm when in the off or nonconducting condition. This array of six switches for a six stage digital filter constitutes a substitution for the dual synchronized switches at the input and output of the digital filters disclosed in my above-referenced patent application.

Figure 3:
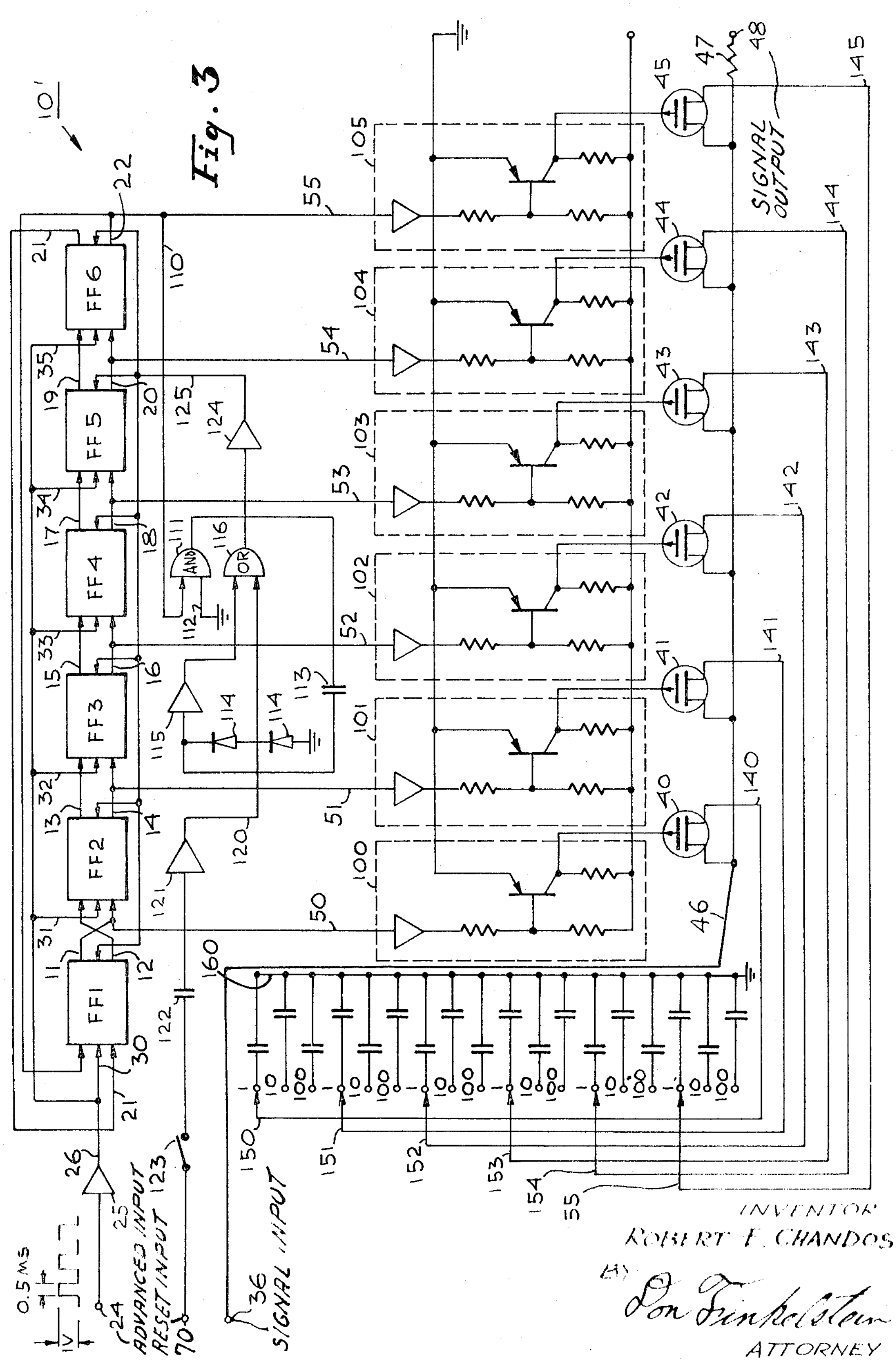
FIG. 3 is an electrical schematic drawing of this invention.

More details of the digital filter 10 of FIG. 1 may be understood by reference to FIG. 3 which illustrates a digital filter 10′ having the basic principles of the digital filter 10 of FIG. 1 and also incorporates the feature of automatic repetitive reset of the ring counter to eliminate the possibility of extraneous pulses entering the system and interfering with its normal switching operation. This latter feature is of great significance inasmuch as a digital wave analyzer, in which this digital filter 10′ is a critical element, is designed for normal, continuous unattended operation for long periods of time and without manual reset of the ring counter. The operation of this feature is best understood by description of the digital filter in the normal sequence of operations. Identical elements in reference to the digital filter 10′ of FIG. 3 carry the same reference numeral as in the digital filter 10 of FIG. 1.

Primary inputs to the digital filter 10′ again are the advance input terminal 24, a power or reset input 70, and a signal input 36 while the digital filter 10′ produces a signal output at terminal 48 constituting the input signal at terminal 36 as modified by the digital filter characteristics. Referring again to the advance input terminal 24 a train of pulses illustrated in the drawing as square waves having a pulse width in the order of 0.5 microsecond and pulse repetition rate in the order of .001 to 100,000 pulses per second as applied thru the buffer amplifier 25 to the first stage FF–1 of a multi stage ring counter illustrated as having six stages, FF–1 thru FF–6. Advance pulses are similarly applied from the bus 26 to the remaining stages through leads 31 thru 35. In the filter 10′ of FIG. 3 the adjacent stages FF–2 thru FF–6 are directly connected by respective leads 13 and 14, 15 and 16, 17 and 18 and 19 and 20, similar to the filter 10 of FIG. 1. However, the coupling between stages FF–1 and FF–2 is reversed such that lead 11 from stage FF–1 is applied at the complementary input to the stage FF–2 and the complementary output of stage FF–1 is applied as the direct input to stage FF–2. This reversal of phasing of stages FF–1 and FF–2 will be explained hereinafter.

The output of lead 11 from stage FF–1 is applied thru lead 50 and a buffer amplifier 100 to MOS switch 40 in similar manner to the filter 10 of FIG. 1. Similarly, the complementary output 14 of stage FF–2 is applied thru lead 51 to amplifier 101 which in turn operates switch 41. The complementary output signals from each of the remaining stages on leads 16, 18, 20 and 22 respectively, are applied to individual amplifiers 102 thru 105 respectively, which operate respective MOS switches 42 thru 45. The direct output of stage FF–6 on lead 21 is applied to the inverted or complementary input terminal of stage FF–1 producing a reversal of phase upon the completion of one cycle ring counter operation.

The complementary output of the stage FF–6 in addition to being applied to buffer amplifier 105 on lead 55 is applied over lead 22 to the direct or "set" input of stage FF–1 and additionally over branch lead 110 is introduced as one of the inputs to an AND gate 111 with the second input AND gate 111 over lead 112 grounded to represent a constant input. The output of AND gate 111 is applied thru a network made up of a series capacitor 113 and a pair of series connected shunt diodes 114 through a buffer amplifier 115 and to an OR gate 116. This OR gate 116 receives its second input over lead 120 from a buffer amplifier 121, coupling capacitor 122 and a switch 123, for the condition of power applied to the circuit through power input terminal 65. The output of the OR gate 116 thru a buffer amplifier 124 and lead 125 is applied to all stages as reset inputs therefore whenever the power is applied to the system upon the closing of switch 123. This will reset all of the stages of the ring counter to their normal condition which is with stage FF–1 conducting and stages FF–2 thru FF–6 nonconducting.

During operation of the digital filter, the same logic network including AND gate 111, capacitance 113 and diode 114 network and OR gate 116 serve to apply reset pulses to all stages of the ring counter 10′ immediately following the reset of stage FF–1 over lead 21. This repetitive reset pulse is applied to stage FF–1 to switch it to a "one" condition and to all remaining stages to switch them to "zero" condition.

The significance of this repetitive reset circuitry is that not only the output pulse from stage FF–6 can switch FF–1, when it is a valid pulse having been received over terminal 24, but in the prior art type of ring counter any extraneous pulse entering the system can circulate providing switching at intervals less than the intended interval. Conceivably, as many as five false pulses could be present in such a prior art ring counter and unless some form of control is provided, such extraneous pulses could circulate continuously. The presence of such dual or multiple extraneous pulses in the digital filter of this invention would, of course, render it ineffective. Owing to the fact that the filter is designed for long term unattended operation the likelihood of such occurrence becomes significant. Therefore, employing the logic circuitry described above, whenever a pulse reaches the stage FF–6 and is fed back to stage FF–1 an independent reset pulse is applied to all stages thereby destroying any other pulses present in the ring counter except in the stage FF–1. Owing to the reversal of connection of stage FF–1 it is normally set to the "one" condition while other stages are set to their "zero" condition.

With this logic present, consider the possibility of a single false or extraneous pulse arriving in the system. It will circulate until the completion of one cycle. In recirculating to the initial stage it will destroy, and therefore replace, the next following valid pulse. Therefore, the maximum susceptibility of the system to operation by an extraneous pulse is for one pulse cycle.

The remainder of the circuitry is shown in more detail in FIG. 3 and also in FIG. 1 with source electrodes of the MOS field effect transistor switches 40 thru 45 applied to a common bus 46 and to an output terminal 48. Drain electrodes of the respective transistors are applied thru respective leads 140 thru 145 and respective selector switches 150 thru 155.

Each of the selector switches 150 thru 155 is connected to a bank of three decade stepped capacitors. For example, 1, 10, and 100 microfarad values. The second terminal of each of the capacitors, which comprise shunt impedance elements, is connected via bus 160 to ground. In a manner similar to that described above for the capacitors 60 through 65 in FIG. 1, the connection of the second terminals of the capacitors to ground provides a signal thereat for the condition of an input signal applied at the input terminal 36. In this embodiment 10′, the input terminal 36 is connected to common signal output line 46 for series connection to the series impedance 47 and signal output terminal 48, in a manner similar to that shown for the embodiment 10 in FIG. 1

When so connected the system of FIG. 3 operates to provide a variable cutoff frequency filter controllable both in the rate of switching from one cutoff frequency to the next, and in individual cutoff frequency, by selection of the position of selection switches 150 thru 155. Of course, by substituting a different value of the series resistor 47 the entire range of the digital filter operation may similarly be changed.

It should be noted in the system of FIG. 3 that again only a single switch in the transmission channel per stage is required to effect accurate switching of the filter. This arrangement eliminates the need in the system disclosed in my earlier patent application of synchronized switches on the input and the output on the digital filter. Moreover the digital filter employing the logic network is virtually immune from interference due to transients or other pulses of unknown origin in the drive circuit.

It must be recognized that for purposes of illustration the digital filter is shown with six stages and designed to provide variable band pass characteristics. More or fewer stages can be used as required and pass characteristics of the filter may be changed without affecting any of the drive circuitry merely by varying the characteristics of the impedance elements in the transmission channel.

I claim:

1. A digital wave filter comprising, in combination:
a ring counter having a plurality of binary stages each having a conducting condition, a nonconducting condition, an input terminal and an output terminal, and interconnection means for interconnecting said plurality of binary stages to allow advancement of a signal input pulse from the first stage of said plurality of binary stages to the last stage of said plurality of binary stages, and means for feeding back said signal input pulse from said output terminal of the last stage to said first stage;
first input terminal means for furnishing advance pulses to said ring counter;
a plurality of switches, one of said plurality of switches connected to said output terminal of each binary stage of said ring counter for operation thereby;
second input terminal means for receiving a signal to be filter processed;
a signal output terminal for providing a filtered output signal;
a common signal output line connected to said second input terminal and said signal output terminal;
a plurality of shunt impedance elements each having a preselected value and each shunt impedance element having a first terminal and a second terminal, and said first terminal connected through one of the plurality of switches to said common signal output line, and said second terminal connected to receive signals for the condition of input signals applied to said second input terminal means;
a series impedance element in said common signal output line and connected in series between said second input terminal and said output terminal; and
said series impedance element and each of said plurality of shunt impedance elements forming a frequency filter;
whereby advance signal pulses applied to said first input terminal cause each of the said switches to conduct sequentially and, said plurality of shunt impedance elements sequentially switched into the signal path through the digital filter to vary its frequency transmission characteristics.

2. The combination in accordance with claim 1 wherein:
said series impedance element comprises a resistor and said plurality of impedance elements comprise capacitor, whereby the digital filter provides a preselected band pass filter characteristic.

3. The combination in accordance with claim 1 wherein:
each of said plurality of switches comprises a field effect transistor having a gate electrode controlled by one of said plurality of binary stages and a source electrode and a drain electrode connecting one of said plurality of shunt impedance elements in shunt with the signal path.

4. The combination in accordance with claim 1 and further comprising:
external reset means operatively connected to each of said plurality of binary stages for setting one stage of said plurality of binary stages to conducting condition and all of the remaining stages of said plurality of binary stages to nonconducting condition for the condition of a power pulse applied to said external reset means.

5. The combination in accordance with claim 4 wherein said external reset means is connected to receive a power input pulse for the condition of power applied to the digital filter, and said external reset means provides said setting of each stage of said plurality of binary stages in response to said power input pulse.

6. A digital filter comprising, in combination:
a ring counter having a plurality of stages and each of said plurality of stages having a plurality of operating conditions comprising a conducting condition and a nonconducting condition;
automatic reset means connected to said ring counter for selectively changing each of said plurality of stages thereof from one operating condition to another operating condition upon receipt of a predetermined information signal;
information signal generating means connected to said automatic reset means for generating said predetermined information signal;
a plurality of switch means, each one of said switch means operatively connected to one stage of said plurality of stages of said ring counter;
a filter network comprising a single series impedance and a plurality of shunt impedances;
signal conduction path means connected to said plurality of switch means and to said filter network, and each of said plurality of switch means connected to said signal conduction path for connection to one of said shunt impedances;
and means for applying a series of advance pulses to said ring counter, whereby said plurality of switches are operated sequentially and each of said plurality of shunt impedances are sequentially connected into said signal conduction path of the filter.

7. The combination in accordance with claim 6 wherein:
said plurality of switch means each comprise individual field effect transistors each having a source electrode, a drain electrode connected to said signal conduction path for said connection to said shunt impedance, and a gate electrode for said operative connection to one stage of said ring counter.

8. The combination in accordance with claim 6 wherein:
said series impedance comprises a resistor.

9. The combination in accordance with claim 6 wherein said shunt impedances comprise capacitors, whereby said network comprises a variable frequency band pass filter.

10. The arrangement defined in claim 7 wherein:
said operative connection between said gate electrode of each field effect transistor and said one stage of said plurality of stages of said ring counter further comprises a buffer amplifier connected therebetween.

11. The arrangement defined in claim 10 wherein:
each of said plurality of stages of said ring counter has a reset terminal and an output terminal;
said automatic reset means comprises:
a logic circuit having a delay network;
first connection means for connecting said output terminal of the last of said plurality of stages of said ring counter to said delay network of said logic circuit, and said delay network generating a delayed output signal in response thereto;
second connection means for applying said delayed output signal of said delay network to said reset terminal of each of said plurality of stages of said ring counter for switching each of said plurality of stages of said ring counter from one operating condition to another operating condition.